(12) United States Patent
Yoon et al.

(10) Patent No.: US 11,656,292 B2
(45) Date of Patent: May 23, 2023

(54) APPARATUS AND METHOD FOR DETECTING ABNORMALITY IN BATTERY

(71) Applicants: HYUNDAI MOTOR COMPANY, Seoul (KR); Kia Corporation, Seoul (KR)

(72) Inventors: Joon Keun Yoon, Ulsan (KR); Seung Beom Yoon, Hwaseong-si (KR)

(73) Assignees: HYUNDAI MOTOR COMPANY, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 17/392,614

(22) Filed: Aug. 3, 2021

(65) Prior Publication Data

US 2022/0043069 A1 Feb. 10, 2022

(30) Foreign Application Priority Data

Aug. 5, 2020 (KR) .......................... 10-2020-0098093

(51) Int. Cl.
*G01R 31/392* (2019.01)
(52) U.S. Cl.
CPC ................................. *G01R 31/392* (2019.01)

(58) Field of Classification Search
None
See application file for complete search history.

(56) References Cited

U.S. PATENT DOCUMENTS

| 2014/0152259 | A1* | 6/2014 | LePort | H02J 7/0014 |
| | | | | 320/118 |
| 2020/0225292 | A1* | 7/2020 | Ukumori | G01R 31/36 |
| 2020/0412153 | A1* | 12/2020 | Matsumura | H02J 7/0031 |
| 2022/0229122 | A1* | 7/2022 | Lee | G01R 31/396 |

FOREIGN PATENT DOCUMENTS

| KR | 10-2018-0024509 | 3/2018 |
| KR | 10-2059616 | 12/2019 |
| KR | 10-2020-0027326 | 3/2020 |

* cited by examiner

*Primary Examiner* — Jas A Sanghera
(74) *Attorney, Agent, or Firm* — Lempia Summerfield Katz LLC

(57) ABSTRACT

An apparatus for detecting abnormality in a battery, includes: a voltage sensor configured to detect voltages of a plurality of battery cells in a battery; and a controller configured to receive the voltages detected by the voltage sensor and to determine whether the battery cells are abnormal on the basis of voltage changes with respect to charge amounts of the plurality of battery cells during charging of the battery.

14 Claims, 5 Drawing Sheets

APPARATUS AND METHOD FOR DETECTING ABNORMALITY IN BATTERY

CROSS-REFERENCE TO THE RELATED APPLICATION

This application claims priority to and the benefit of Korean Patent Application No. 10-2020-0098093, filed on Aug. 5, 2020, the entire contents of which are incorporated herein by reference.

FIELD

The present disclosure relates to an apparatus and method for detecting abnormality in a battery.

BACKGROUND

The statements in this section merely provide background information related to the present disclosure and may not constitute prior art.

Eco-friendly vehicles such as hybrid vehicles and electric vehicles obtain power using a motor that converts electric energy into rotational mechanical energy. Electric vehicles including such a motor have a battery that is a storage device for storing electric energy supplied to the motor.

In general, a battery is implemented in such a manner that a plurality of battery cells is electrically connected in order to output a high voltage. To maintain high battery performance, a battery is managed such that voltage deviation in battery cells forming the battery is reduced. To this end, a battery management system (BMS) monitors voltages of the battery cells all the time.

Conventionally, battery management is performed mainly on the basis of voltages, current and temperatures of battery cells which are battery characteristic factors detected from the battery. That is, management is performed in such a manner that a battery cell having a voltage different from those of other cells by a reference value or more, or a battery cell having current different from those of other cells by a reference value or more during charging/discharging is determined to be an abnormal cell. Alternatively, battery cells are determined to be abnormal when the temperature of the battery is increased to be considerably higher than a reference value.

However, even when an undesired effect as short-circuit or side reaction (undesired reaction that consumes power provided to battery cells or output from the battery cells) occurs in a battery cell, the voltage of the battery cell may be in a preset normal range and may not considerably differ from those of other normal battery cells, and thus there is a restriction on determination of battery abnormality.

It will be understood that the above matters described in the related art are merely for promotion of understanding of the background of the disclosure and should not be recognized as prior art well-known to those skilled in the art.

SUMMARY

The present disclosure provides an apparatus and method for detecting abnormality in a battery, which can detect battery abnormality that cannot be checked using fragmentary battery information, such as the voltage, current and temperature of the battery, and take an action against the battery abnormality.

In one form of the present disclosure, an apparatus for detecting abnormality in a battery includes: a voltage sensor configured to detect voltages of a plurality of battery cells in a battery; and a controller configured to receive the voltages detected by the voltage sensor and to determine whether the battery cells are abnormal on the basis of voltage changes with respect to charge amounts of the plurality of battery cells during charging of the battery.

In one form of the present disclosure, the controller may generate profiles with respect to relationships between charge amounts and voltages of the plurality of battery cells during charging of the battery, and analyze the profiles to determine a battery cell having different voltage change with respect to a charge amount from those of other battery cells as an abnormal battery cell.

In one form of the present disclosure, the controller may generate profiles with respect to relationships between charge amounts and voltages of the plurality of battery cells during charging of the battery, and analyze the profiles to determine a battery cell having voltage change different from an average of voltage changes with respect to charge amounts of the battery cells by a preset reference value or more as an abnormal battery cell.

In one form of the present disclosure, the controller may generate profiles with respect to relationships between charge amounts and voltages of the plurality of battery cells during charging of the battery, and analyze the profiles to determine a battery cell having a magnitude of voltage change with respect to a charge amount which is less than a preset reference value as an abnormal battery cell.

In one form of the present disclosure, the controller may calculate "dQ/dV" (Q being a charge amount of a battery cell and V being a voltage of the battery cell) by differentiating charge amounts according to voltages of the plurality of battery cells during charging of the battery, and determine a battery cell having a "dQ/dV" value greater than a preset reference value in a preset voltage range as an abnormal battery cell.

In one form of the present disclosure, the controller may cut off electrical connection between the battery and a charger, which supplies charging power to the battery, upon determining that abnormality has occurred in at least some of the plurality of battery cells.

In one form of the present disclosure, the controller may warn a vehicle having the battery or a driver of the vehicle about occurrence of battery abnormality upon determining that abnormality has occurred in at least some of the plurality of battery cells.

In another form of the present disclosure, a method for detecting abnormality in a battery, using the aforementioned apparatus for detecting abnormality in a battery, includes: receiving, by the controller, voltages of the plurality of battery cells from the voltage sensor during charging of the battery; generating, by the controller, profiles with respect to relationships between charge amounts and voltages of the plurality of battery cells; analyzing, by the controller, voltage changes with respect to charge amounts of the plurality of battery cells using the generated profiles; and determining, by the controller, whether the battery cells are abnormal on the basis of analysis results.

In one form of the present disclosure, the determining step may include determining, by the controller, a battery cell having different voltage change with respect to a charge amount from those of other battery cells as an abnormal battery cell.

In one form of the present disclosure, the determining step may include determining, by the controller, a battery cell having voltage change different from an average of voltage changes with respect to charge amounts of the battery cells by a preset reference value or more as an abnormal battery cell.

In one form of the present disclosure, the determining step may include determining, by the controller, a battery cell having a magnitude of voltage change with respect to a charge amount which is less than a preset reference value as an abnormal battery cell.

In one form of the present disclosure, the determining step may include calculating, by the controller, "dQ/dV" (Q being a charge amount of a battery cell and V being a voltage of the battery cell) by differentiating charge amounts according to voltages of the plurality of battery cells during charging of the battery, and determining, by the controller, a battery cell having a "dQ/dV" value greater than a preset reference value in a preset voltage range as an abnormal battery cell.

In one form of the present disclosure, the method may further include cutting off, by the controller, electrical connection between the battery and a charger, which supplies charging power to the battery, upon determining that abnormality has occurred in at least some of the plurality of battery cells.

In one form of the present disclosure, the method may further include warning, by the controller, a vehicle including the battery or a driver of the vehicle about occurrence of battery abnormality upon determining that abnormality has occurred in at least some of the plurality of battery cells.

According to the apparatus and method for detecting abnormality in a battery, it is possible to determine whether battery abnormality has occurred more accurately and rapidly by determining battery abnormality on the basis of battery charge and voltage change during battery charging as compared to a conventional technique of determining abnormality only using the magnitudes of factors (voltage, current, temperature, etc.) representing battery characteristics.

Therefore, according to the apparatus and method for detecting abnormality in a battery, it is possible to inhibit occurrence of more serious secondary accidents such as a fire due to short-circuit or side reaction of a battery cell.

It will be appreciated by persons skilled in the art that the effects that can be achieved with the present disclosure are not limited to what has been particularly described hereinabove and other advantages of the present disclosure will be more clearly understood from the following detailed description.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
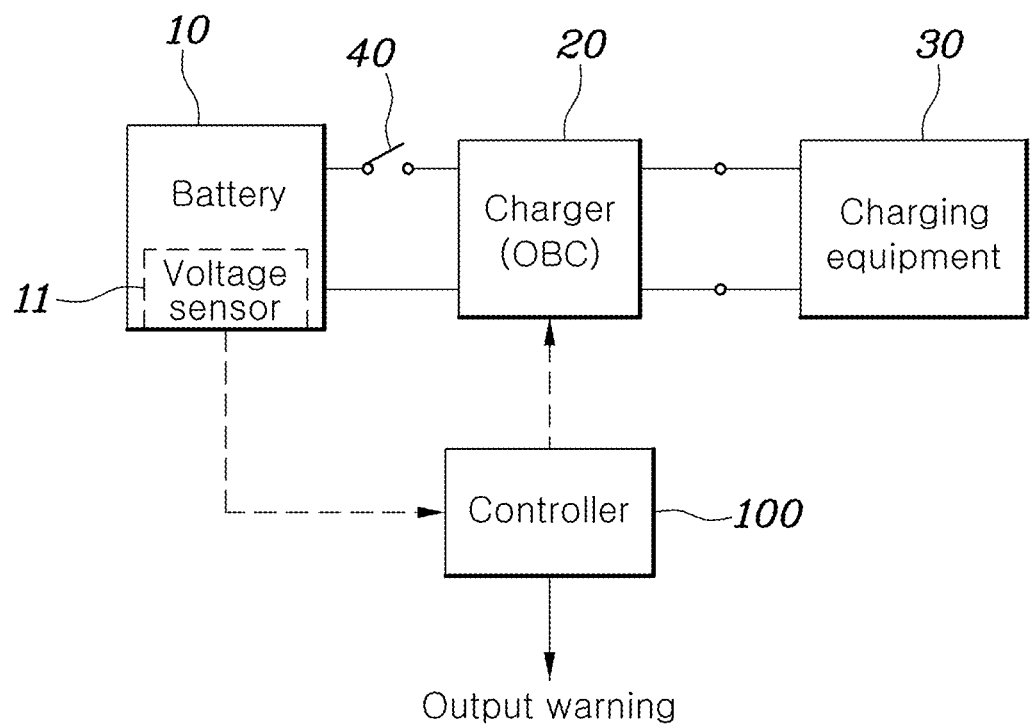
FIG. 1 is a block diagram of an apparatus for detecting abnormality in a battery according to one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Hereinafter, an apparatus and method for detecting abnormality in a battery according to various forms will be described in detail with reference to the attached drawings.

FIG. 1 is a block diagram of an apparatus for detecting abnormality in a battery according to one form of the present disclosure.

Referring to FIG. 1, the apparatus for detecting abnormality in a battery according to one form of the present disclosure may include a voltage sensor 11, which detects voltages of a plurality of battery cells included in a battery 10, and a controller 100, which receives the voltages of the battery cells detected by the voltage sensor 11 and determines whether the battery cells are abnormal on the basis of voltage changes with respect to charge amounts of the battery cells.

Here, a charge amount means the amount of electric energy stored in a battery cell and can be derived by those skilled in the art using the rated capacity, state of charge and input charging current of the battery cell.

In various forms of the present disclosure, it can be determined whether a battery cell is abnormal during a charging process of the battery 10. A vehicle may include an on-board charger (OBC) 20 for charging a battery installed in the vehicle, and the charger 20 may be connected to charging equipment 30 through a charging connector (not shown), transform AC charging power from the charging equipment into DC power and provide the DC power to the battery 10.

In addition, the battery 10 may be connected to the charger 20 through a main relay 40.

The charger 20 and the relay 40 are elements included in general electric vehicles and additional detailed description thereof is omitted.

The battery 10 may include a plurality of battery cells (not shown) which outputs unit voltages. A preset number of battery cells may be connected in series and in parallel to form a single module, and one or more such modules are connected to form the battery 10 having a desired output voltage. This structure of the battery 10 is known in the art and thus detailed description thereof with reference to an additional drawing is omitted.

To maintain high performance of the battery 10, it is important to manage the voltages of the battery cells forming the battery 10 so that the battery 10 may include the voltage sensor 11 for detecting the voltages of the battery cells.

The voltage sensor 11 may detect the voltage of each battery cell in the battery 10 or detect a voltage generated from a structure in which a plurality of battery cells is connected in parallel.

The controller 100 may receive the voltages of the battery cells from the voltage sensor 11, monitor the voltages and determine whether the battery cells are abnormal on the basis of voltage changes with respect to charge amounts of the battery cells.

Figure 2:
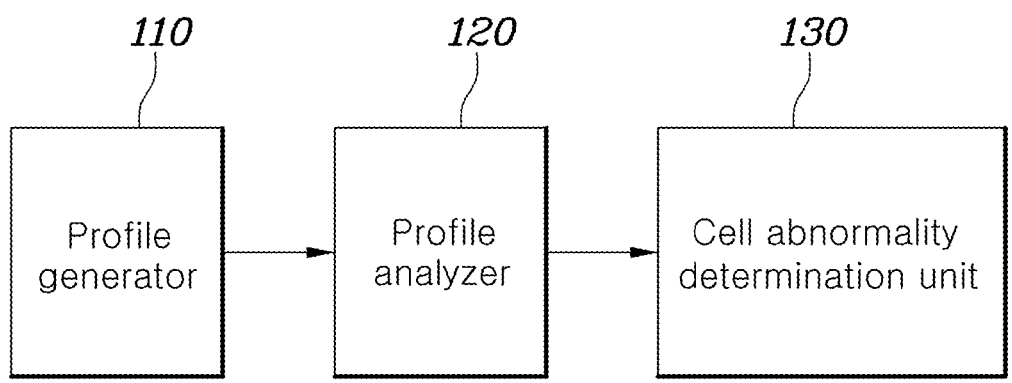
FIG. 2 is a block diagram showing a controller of the apparatus for detecting abnormality in a battery according to one form of the present disclosure in more detail.

FIG. 2 is a block diagram showing the controller of the apparatus for detecting abnormality in a battery according to one form of the present disclosure in more detail.

As shown in FIG. 2, the controller 100 may include a profile generator 110, which generates a profile representing a relationship between an input battery cell voltage and a charge amount of the corresponding battery cell, a profile analyzer 120, which analyzes the generated profile, and a cell abnormality determination unit 130, which determines whether a battery cell is abnormal according to a profile analysis result during charging of the battery 10.

The profile generator 110 can generate a profile by continuously monitoring a relationship between a charge amount of each battery cell and a voltage of the battery cell during battery charging such that change in the battery cell voltage with respect to the charge amount of the battery cell can be checked.

Figure 3:
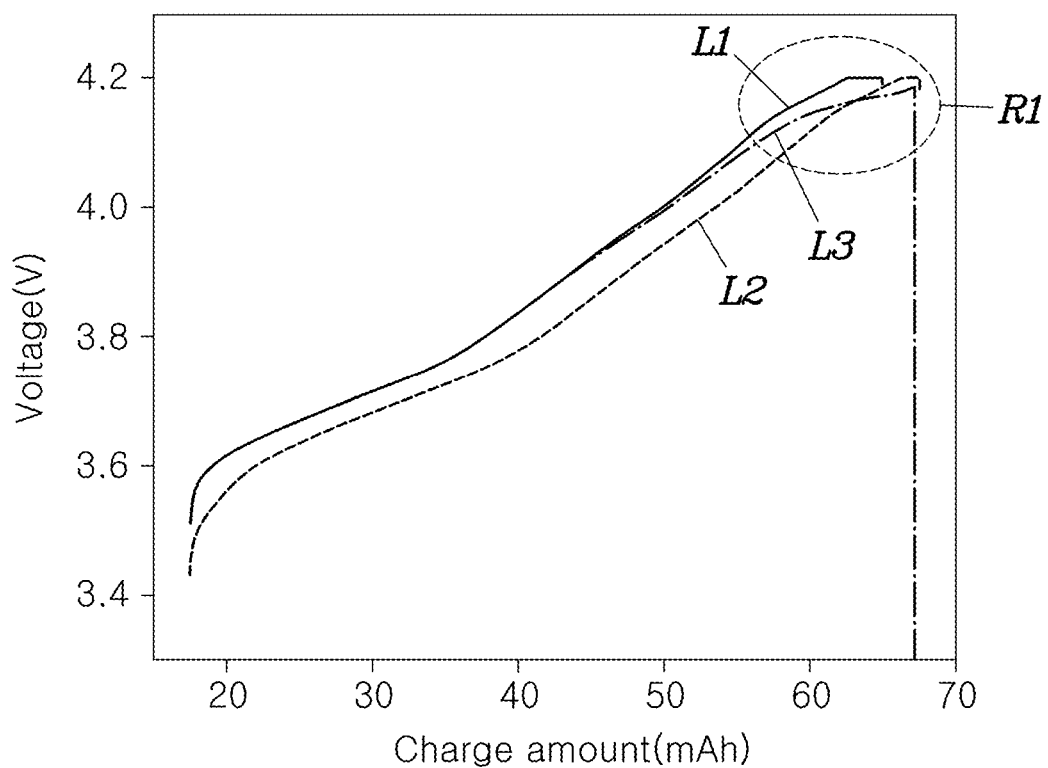
FIG. 3 is a graph showing an example of charge amount-voltage profiles generated in an apparatus and method for detecting abnormality in a battery according to one form of the present disclosure.

FIG. 3 is a graph showing an example of charge amount-voltage profiles generated in an apparatus and method for detecting abnormality in a battery according to one form of the present disclosure.

The profile generator 110 can generate a profile representing a relationship between a capacity and a voltage of a battery cell during charging in the form of a graph, as shown in FIG. 3. In the example of FIG. 3, charge-amount-voltage profiles L1, L2 and L3 with respect to three battery cells are illustrated.

The profile analyzer 120 can analyze charge amount-voltage profiles generated by the profile generator 110. For example, the profile analyzer 120 can analyze voltage change according to charge amount change represented in a charge-amount-voltage profile of each battery cell.

In addition, the profile analyzer 120 can differentiate a charge amount with respect to voltage change in order to easily analyze the voltage change. That is, the profile analyzer 120 can calculate dQ/dV (Q is a charge amount of a battery cell and V is a voltage of the battery cell).

Figure 4:
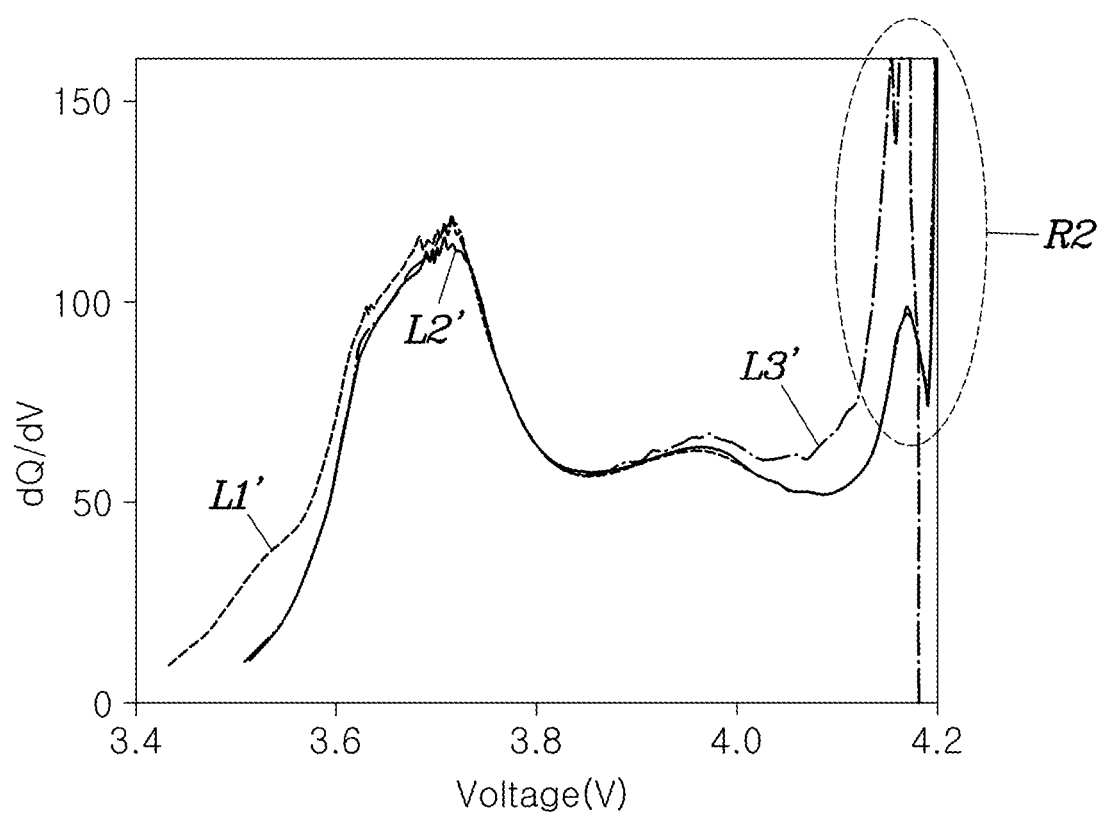
FIG. 4 is a graph showing a result obtained by differentiating charge amounts with respect to voltages derived through charge amount-voltage profiles in the apparatus and method for detecting abnormality in a battery according to one form of the present disclosure.

FIG. 4 is a graph showing a result obtained by differentiating charge amounts with respect to voltages derived through charge amount-voltage profiles in an apparatus and method for detecting abnormality in a battery according to one form of the present disclosure.

FIG. 4 is a graph showing a result derived by differentiating voltage-charge amount profiles as shown in FIG. 3 with respect to voltages, in which a value of dQ/dV with respect to a voltage when voltage change according to charge amount increase is insignificant can be higher than those of other normal battery cells.

The cell abnormality determination unit 130 can determine whether battery cells are abnormal on the basis of analysis results of the profile analyzer 120.

When short-circuit or side reaction has occurred in a battery cell, input charging current cannot be used to charge the battery cell and thus the voltage of the battery cell may not increase. Accordingly, the cell abnormality determination unit 130 can determine that a battery cell is abnormal when the voltage of the battery cell does not increase or decreases distinguished from other normal battery cells. More specifically, the cell abnormality determination unit 130 can determine an abnormal battery cell through a battery cell voltage dispersion test. That is, it is possible to obtain the average of voltage changes according to increases in charge amounts of battery cells and determine that a battery cell having a difference between voltage change and the average by a preset reference value or more is abnormal.

As indicated in a region denoted by "R1" in FIG. 3, the charge amount-voltage profile L3 of an abnormal battery cell has a form different from other charge amount-voltage profiles. Although a degree of battery cell voltage increase considerably decreases after a specific charge amount in the charge amount-voltage profile L3 of the abnormal battery cell, actual voltage values in other normal charge amount-voltage profiles L1 and L2 are different but tendencies thereof are substantially identical.

If battery cell abnormality is determined using the voltage of a battery cell as in the conventional technique, it is not easy to determine whether the battery cell is abnormal because a voltage deviation between a normal cell and an abnormal cell is insignificant, and voltage resolution for abnormality determination needs to be reduced to a very small unit in order to determine abnormality.

However, in one form of the present disclosure, battery abnormality can be determined more easily because the battery abnormality is determined on the basis of a tendency of voltage change.

Alternatively, the cell abnormality determination unit 130 can determine a battery cell as an abnormal battery cell when voltage change in the battery cell is less than a preset reference value as a result of analysis of the charge amount-voltage profile of the battery cell. Here, the reference value compared to change in a battery cell is determined in advance through an experimental method. Short-circuit or side reaction is caused to occur in a battery cell subject to an experiment, which is the same as a battery cell applied to an actual battery. Then, a reference value by which the battery cell is determined to be abnormal through repeated experiments can be determined.

Alternatively, when a dQ/dV value obtained by differentiating a battery charge amount with respect to a voltage significantly increases to be higher than a preset reference value at a specific voltage, as shown in FIG. 4, the cell abnormality determination unit 130 can determine the corresponding battery cell to be abnormal. That is, when voltage increase is reduced at a specific voltage, the dQ/dV value at the voltage can be large. When the dQ/dV value is larger than a reference value, the battery cell can be determined to be abnormal. The reference value compared to the dQ/dV can also be derived in advance according to an experimental method.

In addition, the cell abnormality determination unit 130 can perform control for stopping battery charging and warn a vehicle or a driver about battery abnormality upon determining that a battery cell is abnormal. The cell abnormality determination unit 130 may visually display occurrence of battery cell abnormality through a cluster or an audio video navigation (AVN) system of a vehicle or output the same in an auditory manner through a speaker of the vehicle.

Figure 5:
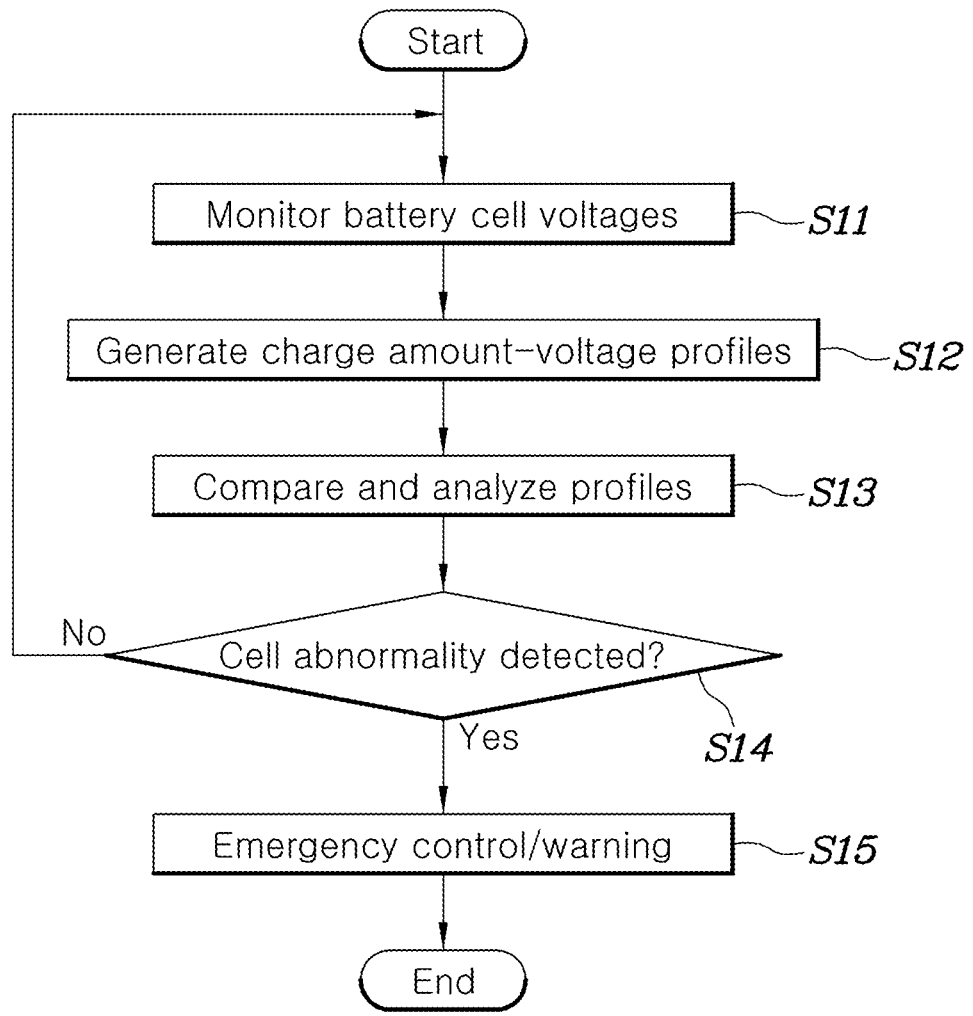
FIG. 5 is a flowchart showing a method for detecting abnormality in a battery according to one form of the present disclosure.

FIG. 5 is a flowchart showing a method for detecting abnormality in a battery according to one form of the present disclosure.

The method for detecting abnormality in a battery according to one form of the present disclosure can be implemented by the above-described apparatus for detecting abnormality in a battery and may include a step S11 in which the controller 100 receives voltages of battery cells from the voltage sensor 11 during battery charging, a step S12 in which the controller 100 generates profiles with respect to relationships between charge amounts and voltages of the battery cells, and a step S13 in which the controller 100 analyzes voltage changes with respect to the charge amounts of the battery cells using the profiles generated in step S12 and determines whether the battery cells are abnormal on the basis of analysis results.

The controller 100 may receive the voltages of the battery cells from the voltage sensor 11 of the battery 10 in step S11 and generate voltage-charge amount profiles as shown in FIG. 3 in step S12.

Subsequently, the controller 100 may perform comparative analysis on the generated profiles and determine a battery cell to be abnormal when voltage change in the battery cell according to increase in the charge amount of the battery cell decreases distinguished from other normal battery cells in step S13.

Further, the controller 100 may determine the battery cell to be abnormal when voltage change in the battery cell is less than a preset reference value as a result of analysis of the charge amount-voltage profile of the battery cell in step S13.

Alternatively, the controller 100 may differentiate battery charge amounts with respect to voltages, and when a dQ/dV value derived from the differentiation considerably increases to be higher than a preset reference value at a specific voltage, determine the corresponding battery cell to be abnormal.

In one form of the present disclosure, upon detection of abnormality in a battery cell (S14), the controller 100 can perform control of turning off the relay 40 provided on a route through which charging power is supplied to the battery 10 to stop battery charging and may warn the vehicle or a driver about the battery abnormality (S15). The controller 100 may visually display occurrence of battery cell abnormality through a cluster or an audio video navigation (AVN) system of the vehicle or output the same in an auditory manner through a speaker of the vehicle in step S15.

As described above, the apparatus and method for detecting abnormality in a battery according to various forms of the present disclosure can determine battery abnormality on the basis of a battery charge amount and voltage change during battery charging instead of determining battery abnormality on the basis of factors (voltage, current and temperature) indicating battery characteristics, and thus can determine whether battery abnormality has occurred more accurately and rapidly. Accordingly, it is possible to inhibit occurrence of more serious secondary accidents such as a fire due to short-circuit or side reaction in a battery cell.

Although the preferred forms of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. An apparatus for detecting an abnormality in a battery, the apparatus comprising:
    a voltage sensor configured to detect voltages of a plurality of battery cells in a battery; and
    a controller configured to receive the voltages detected by the voltage sensor, and to determine whether the plurality of battery cells are abnormal on the basis of voltage changes with respect to charge amounts of the plurality of battery cells during charging of the battery,
    wherein the controller is further configured to determine an abnormal battery cell based on a "dQ/dV" value, and
    wherein dQ is a differentiated charge amount of each battery cell of the plurality of battery cells and dV is a differentiated voltage of each battery cell of the plurality of battery cells.

2. The apparatus according to claim 1, wherein the controller is configured to:
    generate profiles with respect to relationships between charge amounts and voltages of the plurality of battery cells during charging of the battery;
    analyze the profiles; and
    determine a battery cell of the plurality of battery cells having a different voltage change with respect to a charge amount from a voltage change of other battery cells of the plurality of battery cells as the abnormal battery cell.

3. The apparatus according to claim 1, wherein the controller is configured to:
    generate profiles with respect to relationships between charge amounts and voltages of the plurality of battery cells during charging of the battery;
    analyze the profiles; and
    determine a battery cell of the plurality of battery cells having a voltage change different from an average of voltage changes with respect to charge amounts of the plurality of battery cells by a preset reference value or more as the abnormal battery cell.

4. The apparatus according to claim 1, wherein the controller is configured to:
    generate profiles with respect to relationships between charge amounts and voltages of the plurality of battery cells during charging of the battery;
    analyze the profiles; and
    determine a battery cell of the plurality of battery cells having a magnitude of voltage change with respect to a charge amount which is less than a preset reference value as the abnormal battery cell.

5. The apparatus according to claim 1, wherein the controller is configured to:
    calculate the "dQ/dV" value by differentiating charge amounts according to voltages of the plurality of battery cells during charging of the battery; and
    determine a battery cell having the "dQ/dV" value greater than a preset reference value in a preset voltage range as the abnormal battery cell,
    wherein Q is a charge amount of each battery cell of the plurality of battery cells and V is a voltage of each battery cell of the plurality of battery cells.

6. The apparatus according to claim 1, wherein:
    the controller is configured to cut off an electrical connection between the battery and a charger upon determining that the abnormality has occurred in at least one battery cell of the plurality of battery cells, and
    the charger is configured to supply charging power to the battery.

7. The apparatus according to claim 1, wherein the controller is configured to warn a vehicle including the battery or a driver of the vehicle about the occurrence of the battery abnormality upon determining that the abnormality has occurred in at least one battery cell of the plurality of battery cells.

8. A method for detecting an abnormality in a battery, the method comprising:

receiving, by a controller, voltages of a plurality of battery cells from a voltage sensor during charging of the battery;

generating, by the controller, profiles with respect to relationships between charge amounts and voltages of the plurality of battery cells;

analyzing, by the controller, voltage changes with respect to charge amounts of the plurality of battery cells using the generated profiles; and determining, by the controller, whether each battery cell of the plurality of battery cells is abnormal based on a "dQ/dV" value, wherein dQ is a differentiated charge amount of each battery cell of the plurality of battery cells and dV is a differentiated voltage of each battery cell of the plurality of battery cells.

9. The method according to claim 8, wherein determining whether each battery cell of the plurality of battery cells is abnormal based on the "dQ/dV" value comprises:

determining, by the controller, a battery cell of the plurality of battery cells having different voltage change with respect to a charge amount from those of other battery cells of the plurality of battery cells as the abnormal battery cell.

10. The method according to claim 8, wherein determining whether each battery cell of the plurality of battery cells is abnormal based on the "dQ/dV" value comprises:

determining, by the controller, a battery cell of the plurality of battery cells having a voltage change different from an average of voltage changes with respect to charge amounts of the plurality battery cells by a preset reference value or more as the abnormal battery cell.

11. The method according to claim 8, wherein determining whether each battery cell of the plurality of battery cells is abnormal based on the "dQ/dV" value comprises:

determining, by the controller, a battery cell of the plurality of battery cells having a magnitude of voltage change with respect to a charge amount which is less than a preset reference value as the abnormal battery cell.

12. The method according to claim 8, wherein determining whether each battery cell of the plurality of battery cells is abnormal based on the "dQ/dV" value comprises:

calculating, by the controller, the "dQ/dV" value by differentiating charge amounts according to voltages of the plurality of battery cells during charging of the battery; and determining, by the controller, a battery cell of the plurality of battery cells having the "dQ/dV" value greater than a preset reference value in a preset voltage range as the abnormal battery cell, wherein Q is a charge amount of each battery cell of the plurality of battery cells and V is a voltage of each battery cell of the plurality of battery cells.

13. The method according to claim 8, further comprising:

cutting off, by the controller, an electrical connection between the battery and a charger upon determining that the abnormality has occurred in at least one battery cell of the plurality of battery cells, wherein the charger is configured to supply charging power to the battery.

14. The method according to claim 8, further comprising:

warning, by the controller, a vehicle including the battery or a driver of the vehicle about an occurrence of a battery abnormality upon determining that the abnormality has occurred in at least one battery cell of the plurality of battery cells.

* * * * *